United States Patent
Aoki et al.

(10) Patent No.: US 9,667,877 B2
(45) Date of Patent: May 30, 2017

(54) IMAGING DEVICE AND IMAGING METHOD

(71) Applicant: FUJIFILM Corporation, Tokyo (JP)

(72) Inventors: Takashi Aoki, Saitama (JP); Yasuo Ootsuki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/056,246

(22) Filed: Feb. 29, 2016

(65) Prior Publication Data

US 2016/0182794 A1 Jun. 23, 2016

Related U.S. Application Data

(63) Continuation of application No. PCT/JP2014/073639, filed on Sep. 8, 2014.

(30) Foreign Application Priority Data

Sep. 27, 2013 (JP) .................................. 2013-202084

(51) Int. Cl.
*H04N 5/235* (2006.01)
*H04N 5/243* (2006.01)
(Continued)

(52) U.S. Cl.
CPC ......... *H04N 5/2352* (2013.01); *H01L 27/307* (2013.01); *H04N 5/238* (2013.01);
(Continued)

(58) Field of Classification Search
None
See application file for complete search history.

(56) References Cited

U.S. PATENT DOCUMENTS

| | | | | |
|---|---|---|---|---|
| 9,473,725 B2* | 10/2016 | Ono | ...................... | H04N 5/2254 |
| 2011/0049591 A1 | 3/2011 | Nakatani et al. | | |
| 2012/0226480 A1* | 9/2012 | Berkner | ................ | G01J 1/0492 |
| | | | | 703/1 |

FOREIGN PATENT DOCUMENTS

| | | |
|---|---|---|
| JP | 6-326291 A | 11/1994 |
| JP | 2004-170857 A | 6/2004 |

(Continued)

OTHER PUBLICATIONS

International Search Report (PCT/ISA/210) issued in PCT/JP2014/073639, mailed on Dec. 2, 2014.
(Continued)

*Primary Examiner* — James Hannett
(74) *Attorney, Agent, or Firm* — Birch, Stewart, Kolasch & Birch, LLP

(57) ABSTRACT

The imaging device of the present invention includes: an image sensor 14 that is configured such that a plurality of pixels having an organic layer (14-4) for photoelectric conversion is two-dimensionally arranged, and each pixel of the image sensor (14) is divided into a plurality of regions, and has an on-chip microlens (15), which forms a pupil image of a optical imaging system on the plurality of regions, and reading sections (16) which respectively read photoelectrically converted signals of the plurality of divided regions; an optical diaphragm that mechanically stops down rays which are incident into the image sensor 14; and an electronic diaphragm section that electronically controls an aperture value, and that selects signals of the divided regions corresponding to the aperture value from the signals of the plurality of divided regions, on the basis of the aperture value which is controlled by the optical diaphragm.

15 Claims, 13 Drawing Sheets

(51) Int. Cl.
    *H04N 5/238*    (2006.01)
    *H04N 5/357*    (2011.01)
    *H01L 27/30*    (2006.01)
    *H04N 5/359*    (2011.01)
(52) U.S. Cl.
    CPC ........... *H04N 5/2351* (2013.01); *H04N 5/243* (2013.01); *H04N 5/3572* (2013.01); *H04N 5/3597* (2013.01)

(56) References Cited

FOREIGN PATENT DOCUMENTS

| JP | 2006-259055 A | 9/2006 |
| JP | 2009-044425 A | 2/2009 |
| JP | 2009-159357 A | 7/2009 |
| JP | 2011-071483 A | 4/2011 |

OTHER PUBLICATIONS

Written Opinion (PCT/ISA/237) issued in PCT/JP2014/073639, mailed on Dec. 2, 2014.

* cited by examiner

FIG. 11
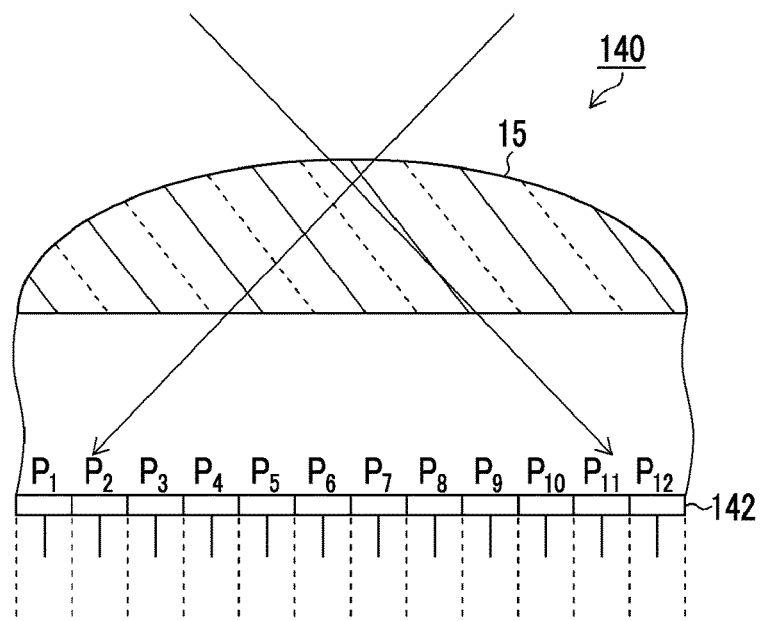
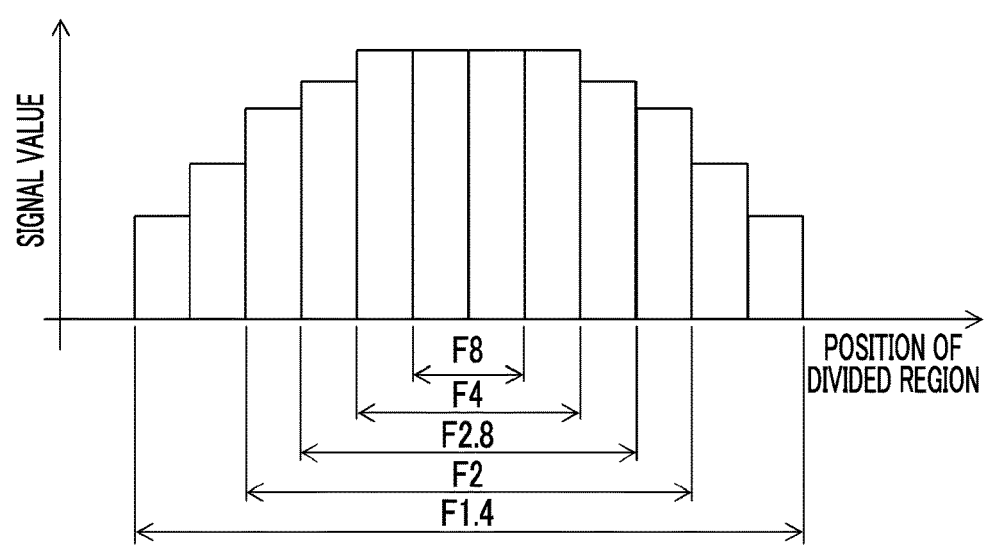

IMAGING DEVICE AND IMAGING METHOD

CROSS-REFERENCE TO RELATED APPLICATIONS

This application is a Continuation of PCT International Application No. PCT/JP2014/073639 filed on Sep. 8, 2014, which claims priority under 35 U.S.C. §119(a) to Japanese Patent Application No. 2013-202084 filed on Sep. 27, 2013. Each of the above applications is hereby expressly incorporated by reference, in their entirety, into the present application.

BACKGROUND OF THE INVENTION

1. Field of the Invention

The present invention relates to an imaging device and an imaging method. In particular, the present invention relates to an imaging device, which has an image sensor in which an organic layer serves as a photoelectric conversion section, and an imaging method therefor.

2. Description of the Related Art

In the past, there has been proposed an imaging device including: an imaging lens that has an aperture diaphragm; an imaging element that keeps a traveling direction of rays invariant, receives the rays, and generates captured image data including a plurality of pixel data pieces; a microlens array in which a single microlens is allocated for a plurality of pixels of the imaging element; and an image processing section (JP2009-159357A).

The imaging device described in JP2009-159357A is a type of a so-called light field camera. If the captured image data is input to the image processing section, a plurality of pixel data pieces constituting captured image data is weighted in the traveling direction of the rays, and predetermined integration processing is performed thereon, thereby reconstructing an image (image data) in which an arbitrary focus is set.

Further, in the image sensor applied to the imaging device, generally, a photodiode having a silicon crystal structure formed in a silicon substrate is used as a photoelectric conversion layer. However, there has been proposed an image sensor in which an organic layer is used as a photoelectric conversion section (JP2011-71483A).

The photoelectric conversion section formed of the organic layer has an absorption coefficient larger than that of photodiodes, and therefore reduction in thickness is achieved. As a result, there are the following advantages: electric charge diffusion to adjacent pixels is small; optical color mixture and electric color mixture (crosstalk) are unlikely to occur even if an angle of rays incident onto a light receiving surface is large; and the reduction in thickness is appropriate for miniaturization of the pixel size.

Further, JP2004-170857A describes a zoom lens in which ghost light is prevented from occurring. JP2009-44425A describes an imaging device capable of eliminating ghost light.

The zoom lens described in JP2004-170857A is a zoom lens having four lens groups, and is characterized in that a second lens group has light blocking means that blocks ghost light which occurs since light incident through a first lens group is reflected on an inner wall of a barrel.

An imaging device described in JP2009-44425A includes an imaging section that captures an image of a subject, and a signal processing circuit that processes a captured image signal. The imaging section includes: a lens group that concentrates subject light from the subject; an adjustable diaphragm that adjusts a light amount of subject light in the lens group; an IR transmission filter that transmits the incident infrared light; and an imaging element that captures an image of the subject. The signal processing circuit generates image data, in which ghost light is eliminated, on the basis of the captured images which are captured under conditions where diaphragm diameters are mutually different.

SUMMARY OF THE INVENTION

JP2009-159357A and JP2011-71483A do not describe the point of eliminating ghost light.

The zoom lens described in JP2004-170857A is characterized in that the zoom lens has the light blocking means that blocks ghost light which occurs since light reflects in an inner wall of a barrel of the zoom lens having the four lens groups.

In the invention described in JP2009-44425A, the ghost light is detected on the basis of differential image data from a difference between data pieces of images captured at mutually different diaphragm diameters. Hence, it is necessary to perform imaging twice at different diaphragm diameters. Further, ghost images included in the image data at the smaller diaphragm diameter cannot be detected.

Further, a camera using an interchangeable lens may be used in a state where an interchangeable lens (incompatible interchangeable lens) made by a different manufacturer is mounted on a camera main body. However, in this case, there are problems in that communication between the interchangeable lens and the camera main body cannot be performed, and the camera main body cannot acquire information (the aperture value and the like) of the interchangeable lens.

The present invention has been made in consideration of the above-mentioned situations, and its object is to provide an imaging device and an imaging method capable of eliminating a ghost image.

Another object of the present invention is to provide an imaging device and an imaging method capable of detecting a current aperture value of an interchangeable lens in the case of using an incompatible interchangeable lens.

According to a first aspect of the present invention, there is provided an imaging device including: an image sensor that is configured such that a plurality of pixels having an organic layer for photoelectric conversion is two-dimensionally arranged, and each pixel of the image sensor is divided into a plurality of regions, and has an on-chip microlens, which forms a pupil image of a optical imaging system on the plurality of regions, and reading sections which respectively read photoelectrically converted signals of the plurality of divided regions; an optical diaphragm that mechanically stops down rays which are incident into the image sensor; and an electronic diaphragm section that electronically controls an aperture value, and that selects signals of the divided regions corresponding to the aperture value from the signals of the plurality of divided regions, on the basis of the aperture value which is controlled by the optical diaphragm.

According to the first aspect of the present invention, the optical diaphragm and the electronic diaphragm are used in combination. Accordingly, ghost light can be eliminated by the optical diaphragm. Further, ghost light, which cannot be eliminated by the optical diaphragm, can be eliminated by the electronic diaphragm. In addition, as for selection of the signals of the divided regions by the electronic diaphragm, when read from the image sensor by the reading sections, the read signals of the pixel regions may be selected, and the signals of the pixel regions corresponding to the aperture value may be selected from the signals of all the pixel regions which are read from the image sensor.

According to a second aspect of the present invention, the imaging device further includes a pixel signal generation section that adds the signals of the divided regions selected by the electronic diaphragm, and generates a pixel signal for each pixel.

According to a third aspect of the present invention, it is preferable that the imaging device further includes a storage section that stores a relationship between the aperture value and the divided regions to be selected by the electronic diaphragm. It is preferable that the electronic diaphragm acquires the corresponding divided regions from the storage section on the basis of the aperture value which is controlled by the optical diaphragm, and selects signals of the acquired divided regions.

According to a fourth aspect of the present invention, the imaging device further includes: a signal strength detection section that detects at least a signal strength of a signal of a peripheral portion among a signal of a central portion and the signal of the peripheral portion in the plurality of divided regions of each pixel which are read by the reading section; and a ghost detection section that detects a ghost image on the basis of the signal strength which is detected by the signal strength detection section.

In the pixel into which ghost light is incident, the signal strength of the divided region, which corresponds to a direction of incidence of ghost light, among the plurality of divided regions is greater than the signal strength of another divided region. Accordingly, it is possible to detect a ghost image on the basis of the signal strengths of the respective divided regions.

In the imaging device according to a fifth aspect of the present invention, it is preferable that if the signal strength of the signal of the peripheral portion is greater than a threshold value on the basis of the signal strength detected by the signal strength detection section, or if a ratio between the signal strength of the signal of the peripheral portion and the signal strength of the signal of the central portion is outside a range of the threshold value, the ghost detection section determines that ghost light is incident into the pixel.

According to a sixth aspect of the present invention, it is preferable that the imaging device further includes a pixel signal generation section that adds the signals of the divided regions selected by the electronic diaphragm, and generates a pixel signal for each pixel. It is preferable that the pixel signal generation section generates the pixel signal of the pixel into which the ghost light is incident, on the basis of the signals of the divided regions, into which the ghost light is not incident, among the plurality of divided regions of the pixel. Thereby, it is possible to eliminate a component of ghost light from the pixel signal of the pixel into which the ghost light is incident.

In the imaging device according to a seventh aspect of the present invention, the optical imaging system is an interchangeable lens including the optical diaphragm.

According to an eighth aspect of the present invention, it is preferable that the imaging device further includes an aperture value detection section that detects a current aperture value of the interchangeable lens, on the basis of the signals of the plurality of divided regions, in a case where information about the aperture value cannot be acquired from the interchangeable lens.

In the case where the incompatible interchangeable lens is mounted, the information about the aperture value cannot be acquired through communication from the interchangeable lens or the like. However, subject light is incident into only the divided region corresponding to the aperture value of the interchangeable lens, in the plurality of divided regions. Accordingly, it is possible to detect a current aperture value of the interchangeable lens on the basis of the signals of the plurality of divided regions.

In the imaging device according to a ninth aspect of the present invention, it is preferable that the aperture value detection section detects the current aperture value of the interchangeable lens, on the basis of the signals of the plurality of divided regions of the pixel in the central portion of the image sensor. The reason for this is that light is incident symmetrically with respect to the center of the plurality of divided regions of the pixel which is at the central portion of the image sensor.

According to a tenth aspect of the present invention, it is preferable that the imaging device further includes a display section that displays the aperture value detected by the aperture value detection section. Thereby, even in the case where the incompatible interchangeable lens is mounted, an operator who operates the optical diaphragm of the interchangeable lens is able to check the current aperture value of the interchangeable lens through the display section.

According to an eleventh aspect of the present invention, the imaging device further includes: a luminance detection section that detects a luminance of a subject; and an auto-exposure control section that controls exposure on the basis of the luminance of the subject which is detected by the luminance detection section. The auto-exposure control section controls a shutter speed on the basis of the luminance of the subject, which is detected by the luminance detection section, and the aperture value which is detected by the aperture value detection section. Thereby, even in the case where the incompatible interchangeable lens is mounted, it is possible to automatically perform exposure control.

According to a twelfth aspect of the present invention, there is provided an imaging device including: an image sensor that is configured such that a plurality of pixels having an organic layer for photoelectric conversion is two-dimensionally arranged, and each pixel of the image sensor is divided into a plurality of regions, and has an on-chip microlens, which forms a pupil image of an interchangeable lens including an optical diaphragm on the plurality of regions, and reading sections which respectively read photoelectrically converted signals of the plurality of divided regions; and an aperture value detection section that detects a current aperture value of the interchangeable lens, on the basis of the signals of the plurality of divided regions, which are read by the reading sections, in a case where information about the aperture value cannot be acquired from the interchangeable lens.

Thereby, even in the case where the incompatible interchangeable lens is mounted, it is possible to detect the current aperture value of the interchangeable lens.

According to a thirteenth aspect of the present invention, there is provided an imaging method for an imaging device including an image sensor that is configured such that a plurality of pixels having an organic layer for photoelectric conversion is two-dimensionally arranged, and each pixel of the image sensor is divided into a plurality of regions, and has an on-chip microlens, which forms a pupil image of a optical imaging system on the plurality of regions, and reading sections which respectively read photoelectrically converted signals of the plurality of divided regions, and an optical diaphragm that mechanically stops down rays which are incident into the image sensor, the imaging method including: a step of acquiring an aperture value which is controlled by the optical diaphragm; a step of selecting signals of the divided regions corresponding to the aperture value from the signals of the plurality of divided regions on the basis of the acquired aperture value; and a step of adding the selected signals of the divided regions for each pixel of the image sensor and generating a pixel signal for each pixel.

According to a fourteenth aspect of the present invention, it is preferable that the imaging method further includes: a step of detecting at least a signal strength of a signal of a peripheral portion among a signal of a central portion and the signal of the peripheral portion in the plurality of divided regions; and a step of detecting a ghost image on the basis of the detected signal strength.

In the imaging method according to a fourteenth aspect of the present invention, it is preferable that the optical imaging system is an interchangeable lens including the optical diaphragm. In addition, it is preferable that the imaging method further includes: a step of reading the signals of the plurality of divided regions in a case where information about the aperture value is not acquired from the interchangeable lens; and a step of detecting a current aperture value of the interchangeable lens, on the basis the read signals of the plurality of divided regions.

According to the present invention, the optical diaphragm and the electronic diaphragm are used in combination. Accordingly, ghost light can be eliminated by both the optical diaphragm and the electronic diaphragm. Further, it is possible to detect the current aperture value of the optical imaging system on the basis of the signals of the plurality of divided regions constituting a single pixel. Thereby, even in the case where the incompatible interchangeable lens is used, it is possible to detect the current aperture value of the interchangeable lens.

BRIEF DESCRIPTION OF THE DRAWINGS

FIG. 11 is a sectional view of principal sections of the image sensor applied to a camera main body according to another embodiment.

DESCRIPTION OF THE PREFERRED EMBODIMENTS

Hereinafter, referring to accompanying drawings, preferred embodiments of an imaging device and an imaging method according to the present invention will be described.

<Appearance of Imaging Device>

Figure 1:
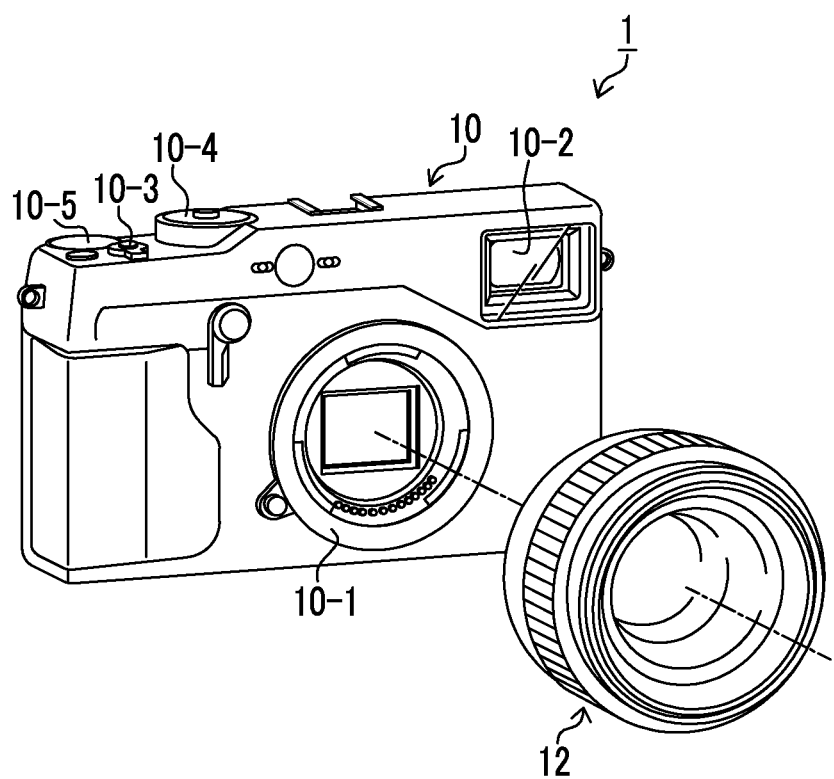
FIG. 1 is a perspective view of an imaging device according to the present invention as viewed obliquely from the front thereof.
Figure 2:
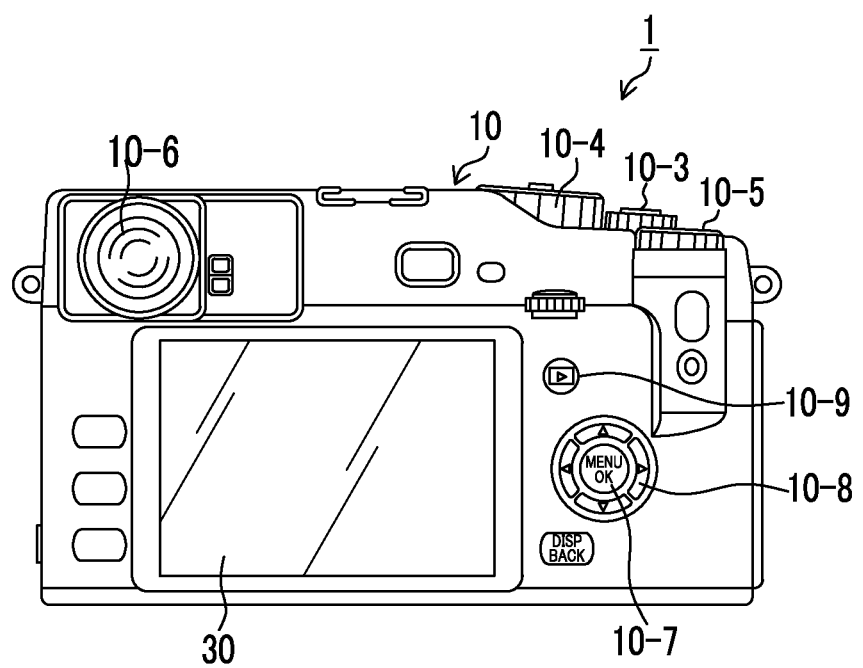
FIG. 2 is a rear view of the imaging device shown in FIG. 1.

FIG. 1 is a perspective view of an imaging device according to the present invention as viewed from the front thereof. FIG. 2 is a rear view of the imaging device.

As shown in FIG. 1, the imaging device 1 includes a camera main body 10, and an interchangeable lens (optical imaging system) 12 which is detachably mounted on the camera main body 10.

A mount 10-1 on which the interchangeable lens unit 12 is mounted, a finder window 10-2 of an optical finder, and the like are provided on the front of the camera main body 10. A shutter release button 10-3, a shutter speed dial 10-4, an exposure correction dial 10-5, and the like are provided on the upper surface of the camera main body 10.

Further, as shown in FIG. 2, mainly a liquid crystal monitor 30, an eyepiece section 10-6 of the optical finder, a MENU/OK button 10-7, an arrow key 10-8, a reproduction button 10-9, and the like are provided on the rear surface of the camera main body 10.

The liquid crystal monitor 30 functions as a display section that not only displays a live view image in an imaging mode or a captured image in a reproduction mode but also displays various menu screens. The MENU/OK button 10-7 is an operation button having both a function as a menu button to give a command to display a menu screen on the liquid crystal monitor 30 and a function as an OK button to give a command to confirm and execute selected contents. The arrow key 10-8 is an operation section to input instructions of four directions of up, down, right, and left, and functions as a button that is for selecting an item from the menu screen or for giving an instruction to select various setting items from the menus. Further, the up/down key of the arrow key 10-8 functions as a zoom switch at the time of imaging or a reproduction zoom switch in the reproduction mode, and the right/left key functions as a frame advance (forward-direction/opposite-direction advance) button in the reproduction mode. The reproduction button 10-9 is a button to switch to a reproduction mode to display a captured and recorded still image or moving image on the liquid crystal monitor 30.

<Configuration of Imaging Device>

Figure 3:
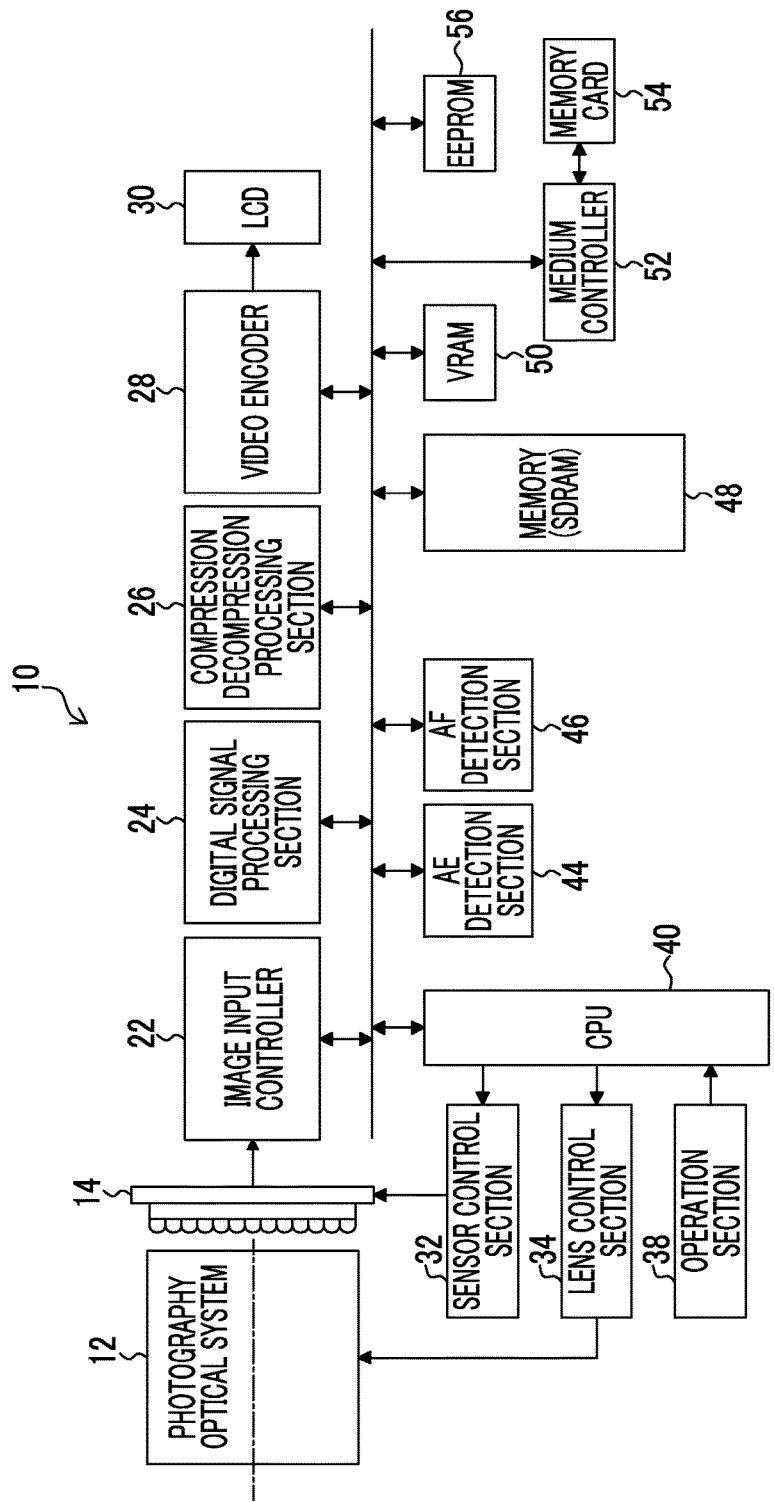
FIG. 3 is a block diagram illustrating an embodiment of a configuration of the imaging device shown in FIG. 1.

FIG. 3 is a block diagram illustrating an embodiment of a configuration of the imaging device 1.

The imaging device 1 is characterized mainly in an image sensor 14 in that an image captured through the optical imaging system (interchangeable lens) 12 and the image sensor 14 is recorded in a memory card 54.

[Image Sensor]

Figure 4:
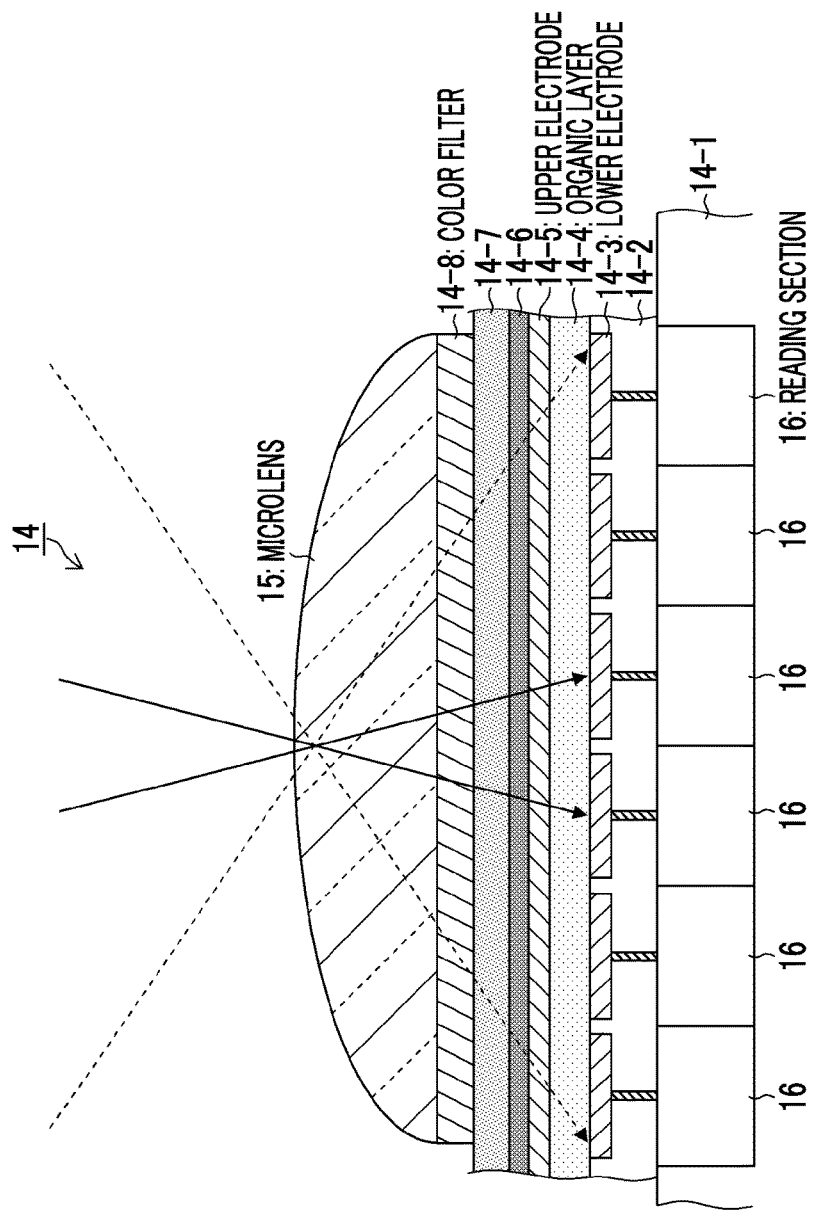
FIG. 4 is a schematic sectional view illustrating a configuration of a single pixel of an image sensor used in the imaging device shown in FIG. 1.

FIG. 4 is a schematic sectional view illustrating a configuration of a single pixel of the image sensor 14.

The image sensor 14 shown in the drawing has an organic layer 14-4 as a photoelectric conversion section. Each one pixel thereof corresponding to a single microlens (on-chip microlens) 15 is divided into a plurality of regions (in the example, 36 regions which are divided in a lattice shape of 6×6). A signal corresponding to signal charge accumulated for each divided region (sectioned region) can be separately read by a reading section 16 formed in the image sensor 14.

That is, the image sensor 14 includes a substrate 14-1, an insulation layer 14-2, lower electrodes (separated electrodes) 14-3, an organic layer 14-4, a common upper electrode 14-5, a buffer layer 14-6, a sealing layer 14-7, color filters 14-8, microlenses 15, and reading sections 16. In addition, each separated electrode 14-3 corresponds to each divided region. Thus, in the organic layer 14-4, there is no separation region for separating the divided regions.

The substrate 14-1 is a semiconductor substrate such as a glass substrate or a Si (silicon) substrate. The reading sections 16 having capacitors are formed as complementary metal oxide semiconductor (CMOS) circuits on the substrate 14-1.

The insulation layer 14-2 is formed on the substrate 14-1. The plurality of separated electrodes 14-3 is formed on the surface of the insulation layer 14-2.

The organic layer 14-4 is formed of a panchromatic photosensitivity organic photoelectric conversion film which is thin. The organic photoelectric conversion film is a structure-free continuous film, and can be provided on the substrate 14-1 having the reading sections 16 (CMOS circuits). Accordingly, the film does not need expensive microfabrication processes required in a silicon technology, and is appropriate for pixel miniaturization.

The upper electrode 14-5 is an electrode that faces the separated electrodes 14-3, and is formed on the organic layer 14-4. The upper electrode 14-5 causes light to be incident into the organic layer 14-4, and is thus made of a conductive material which is transparent to the incident light.

The image sensor 14 includes a voltage supply section (not shown in the drawing) that applies a voltage between the separated electrodes 14-3 and the upper electrode 14-5. In a state where the voltage is applied between the separated electrodes 14-3 and the upper electrode 14-5, light may be incident into the organic layer 14-4. In this case, the organic layer 14-4 generates electric charge corresponding to the amount of light. However, the separated electrode 14-3 functions as a charge collection electrode for collecting electric charge generated in the organic layer 14-4.

The buffer layer 14-6 is formed on the upper electrode 14-5, and the sealing layer 14-7 is formed on the buffer layer 14-6. Further, the color filters 14-8 are provided on the sealing layer 14-7.

The color filters 14-8 have colors of red (R), green (G) or blue (B). Each filter having any one color thereof can be assigned to each one microlens 15 (one pixel). Thereby, the color filters 14-8 are formed in a predetermined pattern array (such as a Bayer array, a G stripe R/G full checkered array, an X-Trans (registered trademark) array, or a honeycomb array).

The microlenses 15 is provided on the color filter 14-8. In addition, the microlens 15 is not limited to the case where it is directly provided on the color filter 14-8, and may be provided with a transparent protective layer interposed therebetween.

As described above, the microlenses 15 are configured such that one microlens 15 is assigned to one pixel formed of 36 divided regions.

The microlens 15 forms a pupil image corresponding to the optical imaging system 12 on the organic layer 14-4, and concentrates rays, which are incident through the optical imaging system 12, for each incidence direction, thereby forming an image thereof on the organic layer 14-4. In a case where the focus is on the microlens 15, an image (pupil image) of light on the organic layer 14-4 under than the microlens 15 is distributed in accordance with an aperture value (F number) of the optical imaging system 12. Accordingly, among the plurality of divided regions constituting one pixel, a signal of a desired divided region corresponding to the F number is selected, thereby generating one pixel signal. In such a manner, the F number can be electronically controlled. In addition, an electronic diaphragm section, which electronically controls the F number, will be described later in detail.

For example, in a conventional back-illuminated Si CMOS sensor, the reading sections (including capacitors) are formed on a side opposite to a light-illuminated surface. However, since Si has a low absorption coefficient to obliquely incident light, the obliquely incident light leaks into adjacent pixels. Further, electric charge generated on the illuminated surface moves horizontally while reaching the reading sections on the opposite side, and is read from the reading sections of the adjacent pixels.

However, in the image sensor 14 of the configuration, the organic layer 14-4 has a high light absorption coefficient. Accordingly, a photoelectric conversion section can be made to be thin. Thus, in a normal CMOS sensor, mixture of electric charge into adjacent pixels is unlikely to occur.

Figure 5:
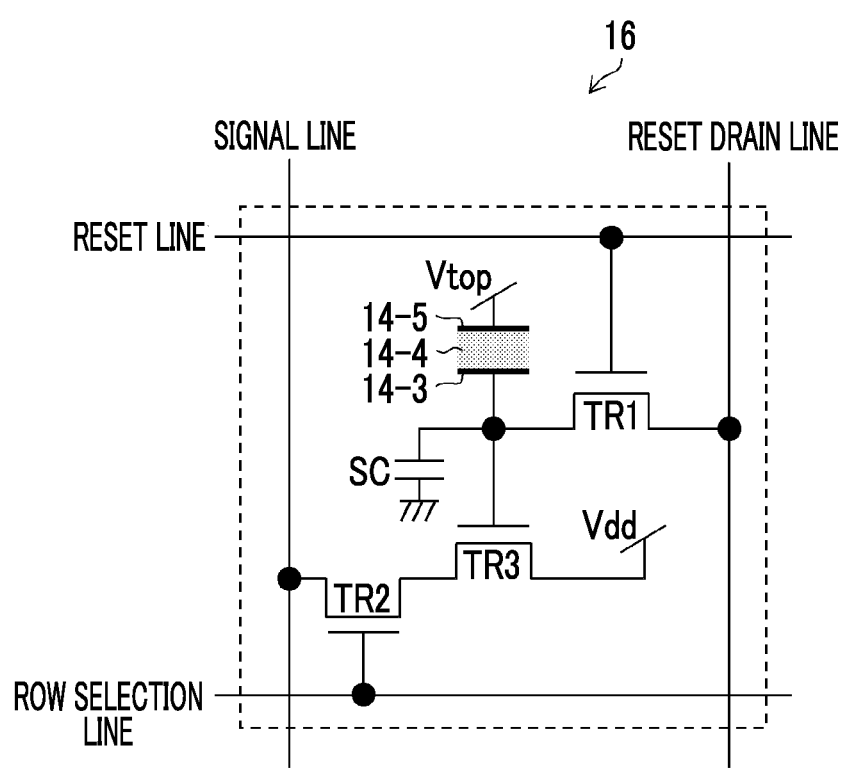
FIG. 5 is a circuit diagram illustrating a configuration of a reading section of the image sensor.

FIG. 5 is a circuit diagram illustrating a configuration of the reading section 16, and shows the reading section 16 corresponding to the single divided region.

As the reading section 16, a CMOS circuit capable of repeatedly reading a signal corresponding to accumulated electric charge in a nondestructive manner is employed. Further, in terms of noise and high-speed performance, it is preferable to employ a CMOS circuit.

As shown in FIG. 5, the reading section 16 includes a capacitor SC, transistors TR1, TR2, and TR3, and the like.

When a voltage Vtop is applied between the separated electrode (lower electrode) 14-3 and the upper electrode 14-5 and light is incident into the organic layer 14-4, the organic layer 14-4 generates electric charge corresponding to an amount of incident light. The electric charge generated in the organic layer 14-4 is collected by the separated electrode 14-3, and accumulated in the capacitor SC.

The reset line is for turning on/off a transistor TR1. When a gate of the transistor TR1 is turned on in response to the signal of the reset line, the electric charge accumulated in the capacitor SC is discharged to the reset and drain lines through the transistor TR1, and is reset to zero.

Row selection signals are applied to row selection lines from a vertical driver 18-1 to be described later. Thus, signals corresponding to electric charges accumulated in the respective capacitors SC are output to the signal lines from the reading sections 16 in a single row corresponding to the row selection line to which the row selection signal is applied. That is, the voltage corresponding to electric charge accumulated in the capacitor SC is output as a signal of the divided region to the signal line through a source follower amplifier formed of the transistor TR2 and the transistor TR3.

Next, a configuration example of peripheral circuits of the image sensor 14 will be described.

Figure 6:
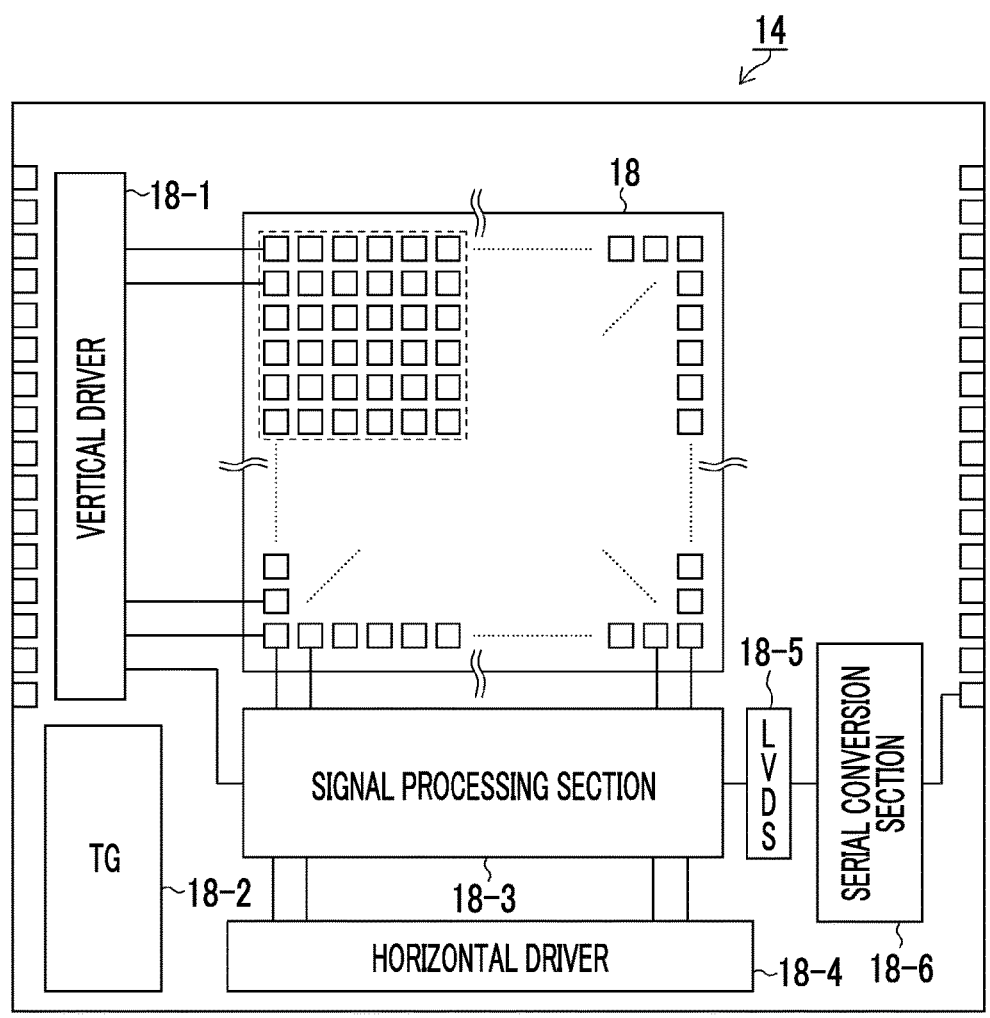
FIG. 6 is a diagram illustrating an example of the entire configuration including peripheral circuits of the image sensor shown in FIG. 4.

FIG. 6 is a diagram illustrating an example of the entire configuration including peripheral circuits of the image sensor 14 shown in FIG. 4.

As shown in FIG. 6, the image sensor 14 has not only the components shown in FIG. 4 but also a vertical driver 18-1, a timing generator 18-2, a signal processing section 18-3, a horizontal driver 18-4, an LVDS (low voltage differential signaling) 18-5, and a serial conversion section 18-6.

In the pixel region 18, a plurality of pixels is two-dimensionally arranged. It should be noted that the region indicated by a dotted line shows a plurality of divided regions each of which constitutes one pixel.

The timing generator 18-2 supplies a timing signal for driving the image sensor 14, and performs reading control of thinning-out reading, partial reading, and the like. The signal processing section 18-3 is provided to correspond to respective columns of the reading sections 16. The vertical driver 18-1 selects the reading sections 16 in a single row, and reads the signals from the selected reading sections 16. The signal processing section 18-3 performs correlated double sampling (CDS) processing on the signals, which are read by the vertical driver 18-1 and are output from the respective columns, corresponding to the single row, and converts the processed signals into digital signals. The signals processed by the signal processing section 18-3 are stored in a memory which is provided for each column. The horizontal driver 18-4 performs control to sequentially read the signals, which are stored in the memory of the signal processing section 18-3, corresponding to the single row and to output the signals to the LVDS 18-5. The digital signals are transmitted in accordance with the LVDS 18-5. The serial conversion section 18-6 converts the input parallel digital signals into serial digital signals, and outputs the signals.

It should be noted that the serial conversion section 18-6 may be omitted. Further, the following configuration may be adopted: the signal processing section 18-3 performs only the correlated double sampling processing, and an AD conversion section is provided instead of the LVDS 18-5. Furthermore, the following configuration may be adopted: the signal processing section 18-3 performs only the correlated double sampling processing, and the LVDS 18-5 and the serial conversion section 18-6 are omitted.

Returning to FIG. 3, the imaging device 1 includes the image sensor 14 shown in FIGS. 4 to 6. The operations of the entire device are integrally controlled by a central processing unit (CPU) 40 on the basis of a camera control program stored in an electrically erasable programmable read-only memory (EEPROM) 56. In addition, the EEPROM 56 stores not only the camera control program but also defect information of the pixels of the image sensor 14, various parameters and tables used in image processing or the like.

The imaging device 1 is provided with an operation section 38 including the shutter release button 10-3 shown in FIGS. 1 and 2, the shutter speed dial 10-4, the exposure correction dial 10-5, the MENU/OK button 10-7, the arrow key 10-8, the reproduction button 10-9, and the like. The signal from the operation section 38 is input to the CPU 40. The CPU 40 controls the circuits of the imaging device 1 on the basis of the input signal. For example, the CPU 40 performs imaging operation control, image processing control, image data recording/reproduction control, display control for the liquid crystal monitor (LCD) 30, and the like.

The shutter release button 10-3 (FIG. 1) is an operation button for inputting an instruction to start imaging, and is formed as a two-stage-stroke-type switch including a S1 switch, which is turned on when pressed halfway, and a S2 switch which is turned on when pressed fully.

In the imaging mode, subject light is imaged on the light receiving surface of the image sensor 14 through the optical imaging system 12.

The CPU 40 issues a command to eliminate electric charge accumulated in the capacitor SC of each reading section 16 of the image sensor 14 through a sensor control section 32, or a command to read a signal corresponding to the electric charge accumulated in the capacitor SC. The image sensor 14 sequentially outputs the signals (digital signals) of individual divided regions of all the pixels to an image input controller 22 when receiving the command to read the signals from the sensor control section 32. It should be noted that the sensor control section 32 also functions as an electronic diaphragm that selects a desired divided region among the plurality of divided regions of each pixel in response to the command from the CPU 40 and that selectively reads the signal of the selected divided region.

The digital signals of individual divided regions of all the pixels, which are read from the image sensor 14, are temporarily stored in the memory (SDRAM) 48 through the image input controller 22.

A digital signal processing section (pixel signal generation section, electronic diaphragm) 24 adds the digital signals corresponding to the plurality of divided regions of each pixel among the digital signals stored in the memory 48, thereby generating a pixel signal for each pixel. In the present example, one pixel has 36 divided regions, and thus the digital signals of individual maximum 36 divided regions are added, thereby generating the pixel signal of one pixel. Further, by selecting the signals of the divided regions corresponding to the F number among the digital signals of the individual 36 divided regions and performing addition thereof, the F number can be electronically controlled.

The digital signal processing section 24 performs predetermined signal processing on the generated pixel signals. The signal processing includes offset processing, gain control processing including white balance correction and sensitivity correction, demosaic processing, gamma correction processing, processing (YC processing) of generating luminance data Y and color difference data Cr and Cb, and the like. Here, the demosaic processing is processing of calculating information of all colors for each pixel from the RGB mosaic image corresponding to a color filter array of a single-plate-type image sensor, and is also referred to as synchronization processing. For example, in the case of the image sensor having color filters of three colors of RGB, the demosaic processing is processing of calculating information of all colors of RGB for each pixel from the mosaic image having RGB colors.

The image data, which is processed by the digital signal processing section 24, is input to a video random access memory (VRAM) 50. The image data, which is read from the VRAM 50, is encoded by a video encoder 28, and output to the liquid crystal monitor 30 provided on the rear surface of the camera main body 10, thereby allowing a subject image to be displayed on the display screen of the liquid crystal monitor 30.

If the shutter release button 10-3 of the operation section 38 is pressed down to a first stage (pressed halfway), the CPU 40 starts an auto exposure (AE) operation. Then, the digital signals, which are input through the image sensor 14 and the image input controller 22, are received in an AE detection section 44.

The AE detection section 44 sums up the digital signals corresponding to the entire screen, or sums up the digital signals, which are differently weighted between the screen central portion and the peripheral portion, and outputs the value of summation to the CPU 40. The CPU 40 calculates a brightness (imaging Ev value) of a subject from the value of summation which is input from the AE detection section 44, and determines an aperture value of a diaphragm (not shown in the drawing) and an electronic shutter (shutter speed) of the image sensor 14 on the basis of the imaging Ev value, in accordance with a predetermined program diagram.

The CPU 40 controls the diaphragm on the basis of the determined F number, and controls a time period of electric charge accumulation in the image sensor 14 through sensor control section 32 on the basis of the determined shutter speed.

An AF (auto focus) detection section 46 sums up absolute values of high-frequency components of the digital signals which are received when the shutter release button 10-3 is pressed halfway and correspond to an AF area, and outputs the sum (AF evaluation value) to the CPU 40. The CPU 40 causes the lens control section 34 to move a focus lens (not shown in the drawing) of the interchangeable lens unit 12 from a close range toward the infinity, search for an in-focus position at which the AF evaluation value detected by the AF detection section 46 is at the maximum, and move the focus lens to the in-focus position, thereby being able to perform focus adjustment on a subject (main subject).

If the AE operation and the AF operation end and the shutter release button 10-3 is pressed down to a second stage (pressed fully), the digital signals are output from the image sensor 14 in response to the pressing, and temporarily stored in the memory 48 through the image input controller 22. The digital signals temporarily stored in the memory 48 are appropriately read by the digital signal processing section 24. Here, the predetermined signal processing mentioned above is performed, and processed luminance data Y and color difference data Cr and Cb are stored in the memory 48 again.

The luminance data Y and color difference data Cr and Cb stored in the memory 48 is output to a compression decompression processing section 26, predetermined compression processing such as a joint photographic experts group (JPEG) is performed. The compressed image data is generated as an image file to which necessary supplementary information such as imaging date and time and imaging conditions is added, and is recorded into a memory card 54 through a medium controller 52.

Further, if the reproduction button 10-9 of the operation section 38 is operated so as to switch the imaging mode to the reproduction mode, the image file recorded in the memory card 54 can be read through the medium controller 52. The image data, which is compressed in the image file read from the memory card 54, is subjected to decompression processing through the compression decompression processing section 26, and subsequently stored in the VRAM 50. Then, the image data stored in the VRAM 50 is encoded by the video encoder 28, is output to the liquid crystal monitor 30, and is thereby displayed as a reproduction image on the display screen of the liquid crystal monitor 30.

<Electronic Diaphragm>

The imaging device 1 has a optical diaphragm (FIG. 8) 12A that is provided in the optical imaging system 12 so as to mechanically control a diaphragm aperture and an electronic diaphragm that electronically controls an aperture value (F number).

The electronic diaphragm may be provided as one function (reading control function) of the sensor control section 32, and may be provided as a signal processing section of the digital signal processing section 24. In the case where the electronic diaphragm is provided as the sensor control section 32, the electronic diaphragm performs selection on the divided regions, which are read from the image sensor 14, on the basis of the F number. In contrast, in the case where the electronic diaphragm is provided as the signal processing function of the digital signal processing section 24, the electronic diaphragm extracts (selects) the signals of the divided regions corresponding to the F number from the signals of all the divided regions which are read from the image sensor 14. In addition, a relationship between the respective F numbers and the divided regions used at the F numbers is stored in the EEPROM 56 (storage section) in advance. Thus, the electronic diaphragm acquires the corresponding divided regions from the EEPROM 56 on the basis of the F number which is controlled by the optical diaphragm 12A, and selects and reads the signals of the acquired divided regions from the image sensor 14, or extracts the signals from the signals of the all the read divided regions.

Figure 7A:
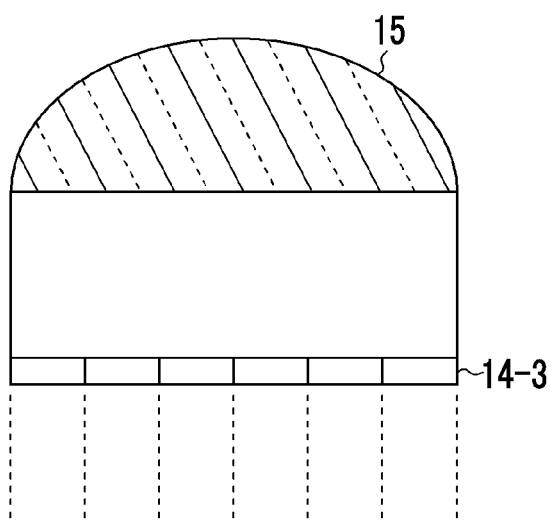
FIGS. 7A and 7B are diagrams illustrating a relationship between an aperture value (F number) and lower electrodes (separated electrodes) of the image sensor.
Figure 7B:
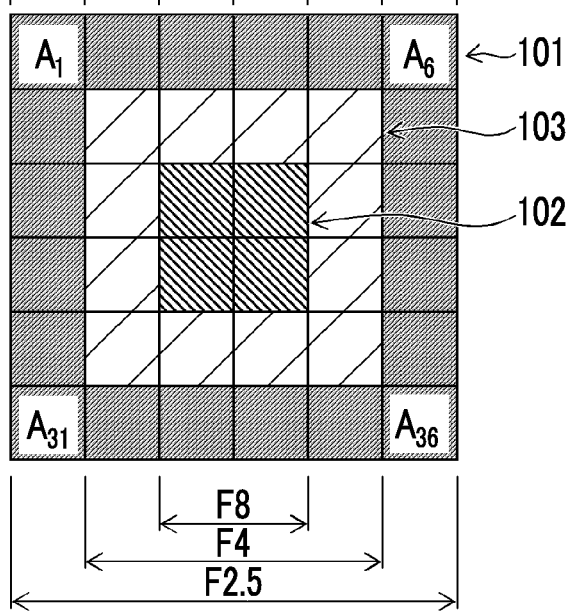

FIGS. 7A and 7B are diagrams illustrating a relationship between the aperture value (F number) and the lower electrodes (separated electrodes) 14-3.

FIG. 7A is a schematic sectional view illustrating a configuration of one pixel of the above-mentioned image sensor 14. Further, FIG. 7B is a schematic diagram of the separated electrodes 14-3 as viewed from the just above.

In the example shown in FIGS. 7A and 7B, the separated electrodes 14-3 are divided with the same division widths. Thereby, the separated electrodes 14-3 can effectively be manufactured. It should be noted that the pixel shown in FIG. 7A is the same as the pixel described in FIG. 4. However, for convenience of description, only the microlens 15 and the separated electrodes 14-3 are shown, and the others are omitted.

As shown in FIG. 7B, the separated electrodes 14-3 are formed to correspond to the respective divided regions which are obtained by dividing one pixel into 6×6, 36 divided regions $A_1$ to $A_{36}$.

As shown in FIG. 4 and FIG. 7B, in the present example, in a case where the optical imaging system 12 is a single focus lens (in a case of a wide end in a zoom lens), light is incident to 6×6, 36 divided regions 101 ($A_1$ to $A_{36}$). Further, the F number at this time is set to F2.5.

Here, in a case where the optical diaphragm 12A is controlled such that it is stopped down to F8, in the image sensor 14, light is incident to only the vicinities of 2×2, 4 divided regions 102 which are positioned at the center of the pixel. Accordingly, only the signals corresponding to the 4 divided regions 102 are read or extracted, whereby it is possible to acquire only signals which correspond to a pupil image obtained when the optical diaphragm 12A is stopped down to F8.

Likewise, as shown in FIG. 7B, by reading or extracting only the signals corresponding to 4×4, 16 divided regions 103 which are positioned at the center of the pixel, it is possible to acquire only signals which correspond to the pupil image obtained when the optical diaphragm 12A is stopped down to F4. Further, by reading the signals corresponding to all the divided regions 101, it is possible to acquire signals corresponding to a pupil image obtained when the optical diaphragm 12A is stopped down to F2.5.

<Method of Eliminating Ghost Light>

Next, a description will be given of a method of eliminating ghost light through the imaging device 1 having the above-mentioned configuration.

Figure 8:
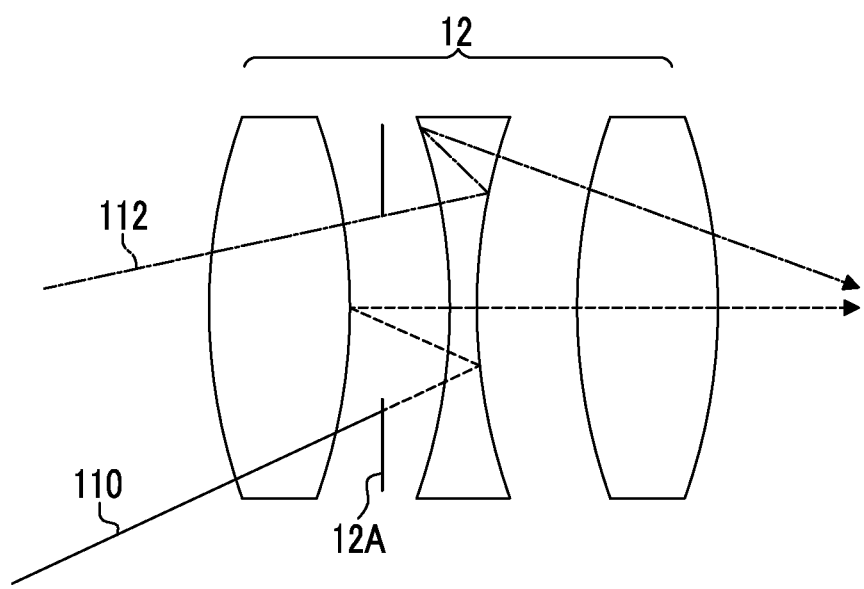
FIG. 8 is a diagram illustrating a optical imaging system in a state where two types of ghost light occur.

FIG. 8 shows a case where two types of ghost light occur in the optical imaging system 12.

The ghost light means light which reflects in a lens or an inner wall of the optical imaging system and is incident as abnormal light into the image sensor in a case where a subject is imaged under sun light or strong illumination.

The ghost light 110 shown in FIG. 8 can be blocked by the optical diaphragm 12A, and is thus not incident into the image sensor 14.

In contrast, the ghost light 112 is not blocked by the optical diaphragm 12A, and is thus incident into the image sensor 14.

However, the ghost light 112 is incident into peripheral divided regions among the 36 divided regions shown in FIG. 7B since an incident angle of incidence into the image sensor 14 is large. Accordingly, in a case of the F number at which the peripheral divided regions are not used, since the signals of the divided regions into which the ghost light 112 is incident are not used, the above-mentioned electronic diaphragm is able to eliminate the ghost light 112.

In a case where the optical diaphragm 12A is not provided, the ghost light 110 is not blocked by the optical diaphragm 12A, and the ghost light 110 is not eliminated by the electronic diaphragm since the angle of incidence into the image sensor 14 is small.

That is, the imaging device 1 is able to eliminate the two types of ghost light 110 and 112 shown in FIG. 8 by using the optical diaphragm 12A and the electronic diaphragm in combination.

In the example hitherto described, the incident angle of light incident into the image sensor is determined by the optical diaphragm. In some cases, in accordance with the zoom ratio or the position of the focus lens, the incident angle of light may not be determined by the optical diaphragm. The light may converge in an area which is smaller than the aperture of the optical diaphragm at a time point at which the light passes through the optical diaphragm. The area in which the light converges does not necessarily have a circular shape, and the aperture of the diaphragm has a circular shape, while the shape for converging light, which passes through the diaphragm, may be a distorted shape. Further, an incident angle of light, which passes through the diaphragm and is then blocked by another member, may be restricted. In such a case, data may be stored in a storage device in a camera or an interchangeable lens. The data indicates a relationship between the divided regions, into which light is incident in the image sensor, and optical conditions including combinations of a zoom ratio, a focus lens position, and an F number of the optical diaphragm. The data of the divided regions corresponding to the optical conditions at the time of imaging is read from the storage device in the camera or the interchangeable lens, and only the signals of the divided regions are extracted, whereby it is possible to eliminate a ghost image.

<Other Embodiments of Method of Eliminating Ghost Light>

Figure 9:
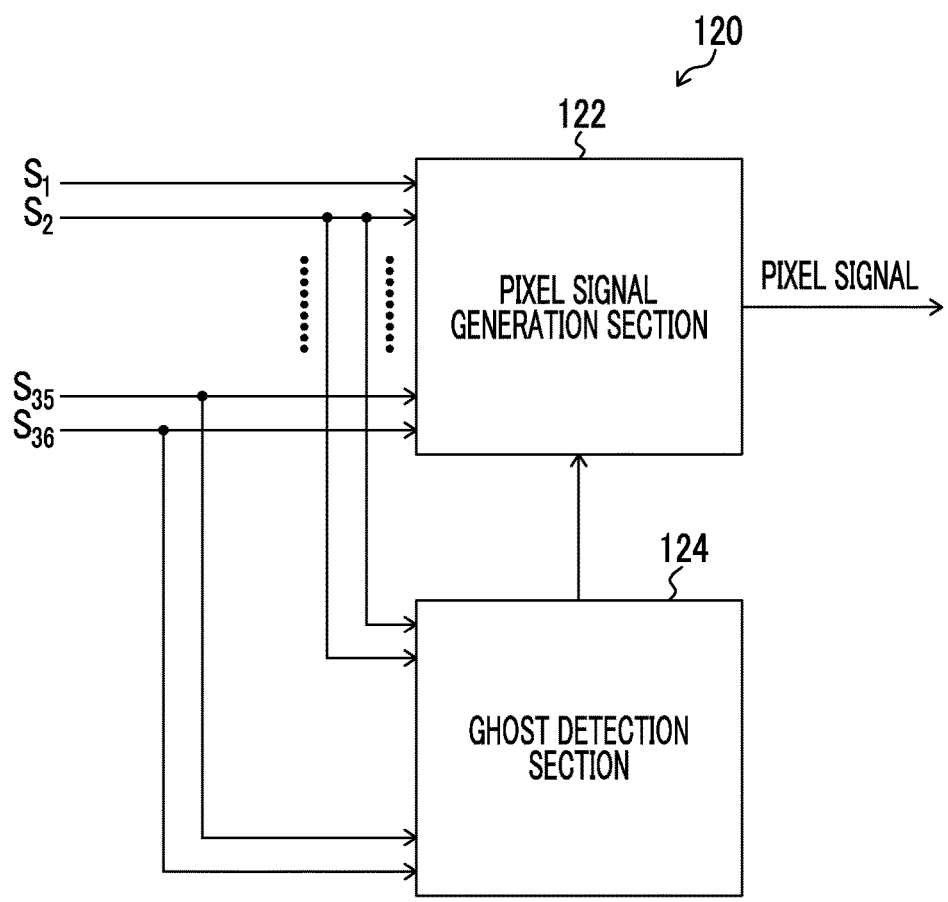
FIG. 9 is a block diagram of principal sections of a ghost light elimination section of the imaging device.

FIG. 9 is a block diagram of principal sections of a ghost light elimination section of the imaging device 1.

The ghost light elimination section 120 mainly includes a pixel signal generation section 122 and a ghost detection section 124, and may be provided in, for example, the digital signal processing section 24.

The signals $S_1$ to $S_{36}$ of the divided regions 101 ($A_1$ to $A_{36}$) (refer to FIGS. 7A and 7B), which are obtained by dividing each one pixel into 36 pieces, are input to the pixel signal generation section 122 and the ghost detection section 124.

The ghost detection section 124 includes a signal strength detection section that detects signal strengths (the signal strength of the central portion of the divided regions, the signal strength of the peripheral portion, and the like) of the signal values of the signals $S_1$ to $S_{36}$, and detects whether or not a ghost image is present, on the basis of the signal values (signal strength) of the signals $S_1$ to $S_{36}$, and specifies divided regions into which ghost light is incident.

Figure 10:
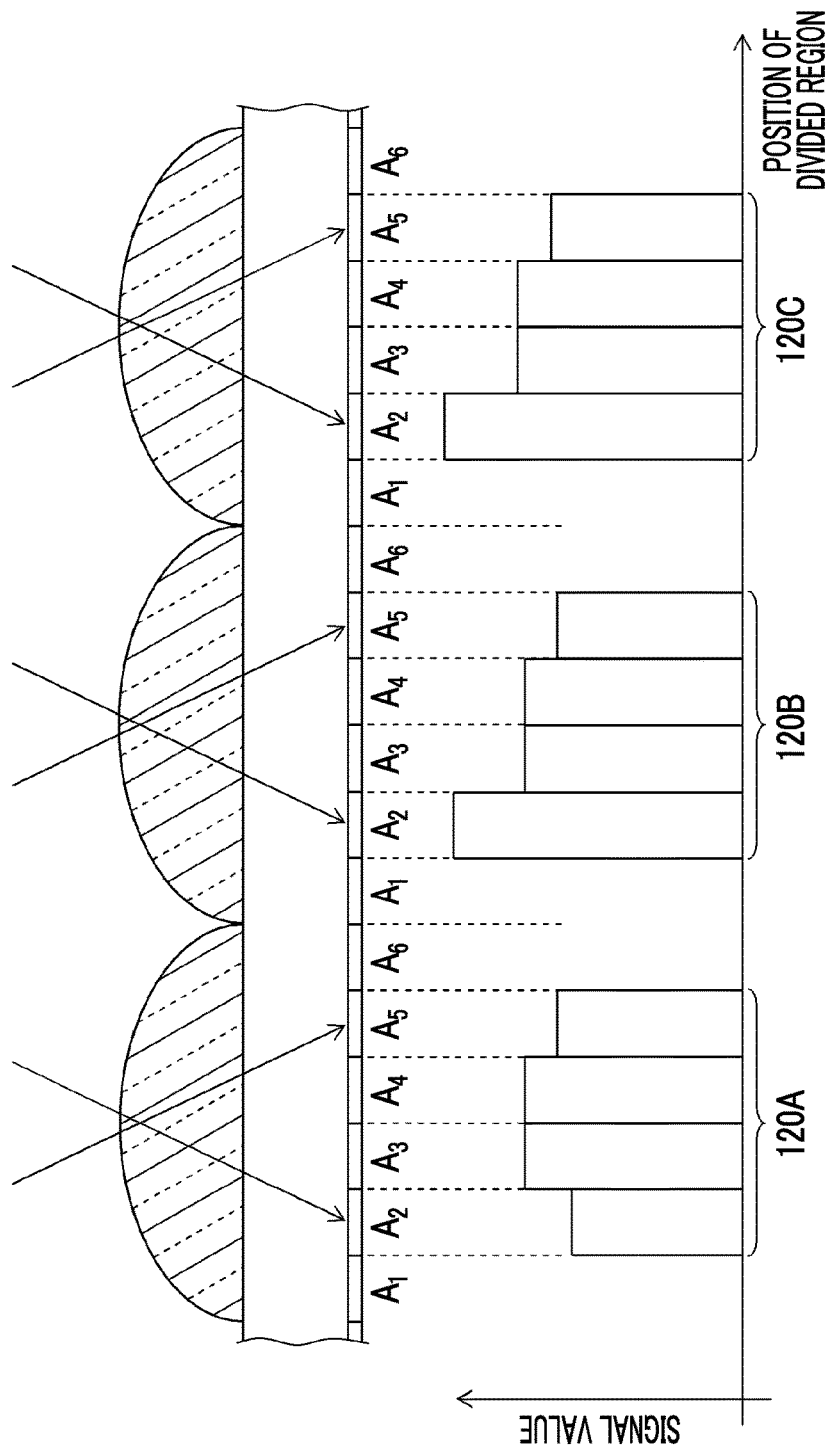
FIG. 10 is a diagram illustrating an example of signal values of respective divided regions of the image sensor.

FIG. 10 is a diagram illustrating an example of signal values of respective divided regions, and shows signal values of one-dimensionally divided regions ($A_1$ to $A_6$) corresponding to three pixels.

In the example shown in FIG. 10, light is incident into the divided regions $A_2$ to $A_5$, and the signals of the divided regions $A_2$ of the pixels 120B and 120C among three pixels 120A, 120B, and 120C represent abnormal values.

That is, light from one point (point corresponding to the pixel), at which a subject is present, is incident at various incident angles through the optical imaging system 12, into the divided regions of each pixel, and the signal values of the divided regions within one pixel have, for example, a certain output pattern corresponding to shading or the like of the optical imaging system 12. Accordingly, it can be determined that light (ghost light) other than light from the original subject is incident into the divided regions from which large signals having values greater than a threshold value are output, as compared with the certain output pattern. Further, when a ratio between the signal strength of the signal of the divided region at the peripheral portion within the pixel and the signal strength of the signal of the divided region at the central portion within the pixel is outside range of the threshold value, it can be determined that ghost light is incident into the pixel.

The ghost detection section 124 specifies the divided regions into which ghost light is incident on the basis of the signal values of the signals $S_1$ to $S_{36}$, and outputs information, which indicates the divided regions, to the pixel signal generation section 122. Further, since a ghost image has normally an area which is equal to or greater than a certain value, ghost light is also incident into peripheral pixels of the pixel into which ghost light is incident. Accordingly, the ghost detection section 124 may detect ghost light in consideration of whether or not the same ghost light is also incident into the peripheral pixels at the time of ghost detection.

As described above, the incident angle of light incident into the image sensor 14 is determined by the optical diaphragm 12A, or is determined depending on optical conditions of combinations of the zoom ratio, the position of the focus lens, the F number of the optical diaphragm. Therefore, a threshold value may be provided in a specific divided region for each aperture value or each optical condition, and it may be determined whether or not ghost light is incident. For example, when the signal strengths of the divided regions closest to the periphery of the pixel are greater than the threshold value, it is determined that a ghost image is present. The threshold value may be set relative to ratios or differences of the signal strengths of the peripheral divided regions within the pixel and the signal strengths of the central divided regions within the pixel as described above, and may be set relative to a signal strength of a specific divided region within the pixel. For example, the threshold value may be set relative to ratios or differences of the signals of the divided regions closest to the periphery within the pixel in one direction and the signals of the divided regions closest to the periphery in a direction opposite thereto.

The incident ray angle is different depending on the position of the pixel within the image sensor. Therefore, the threshold value may be set for each position of the pixels. In addition, representative points may be set in a lattice shape, and a threshold value may be set for each representative point. In this case, the threshold value of the pixel for determining whether or not a ghost image is present may be calculated by performing weighted averaging on the threshold values of the four representative points closest to each other on the basis of coordinates of the pixel and coordinates of the four representative points.

For example, in the case where a threshold value is provided for the signal strength of the specific divided region within the pixel, the threshold value of the specific divided region of the representative point is stored in the storage device for each optical condition. The threshold value data of the specific divided region of the representative point under the optical condition corresponding to a condition at the time of imaging is read from the storage device. The threshold value of the specific divided region of the pixel for ghost determination may be obtained by performing weighted averaging on the read threshold values of the specific divided regions of the four representative points closest to each other on the basis of data about coordinates of the representative points and the pixel.

The pixel signal generation section 122 adds only the signals of the divided regions corresponding to the F number which is set at the time of imaging, as described in FIGS. 7A and 7B, among the input signals $S_1$ to $S_{36}$ of the divided regions corresponding to a single pixel, and generates a pixel signal corresponding to the single pixel.

Here, in a case where information about divided regions into which ghost light is incident is input from the ghost detection section 124, the pixel signal generation section 122 does not add signals of the divided regions, into which ghost light is incident, among the signals of the divided regions subjected to the addition, but adds the other signals. The other signals may be average values of the signals of the divided regions other than the divided regions into which ghost light is incident, or signals which are obtained through interpolation of the signals of the peripheral divided regions of the divided regions into which ghost light is incident.

With such a configuration, it is also possible to eliminate ghost light which cannot be eliminated even if the optical diaphragm 12A and the electronic diaphragm are used in combination.

<Detection of Aperture Value (F Number) and Notice Therefor>

Next, detection of the aperture value (F number) and notice therefor will be described.

The camera main body 10 of the imaging device 1 is configured such that the interchangeable lens can be mounted thereon. However, in some cases, an incompatible interchangeable lens such as an interchangeable lens made by another manufacturer may be connected to the camera main body 10 directly or through a mount adapter.

In this case, communication between the camera main body 10 and the incompatible interchangeable lens is not possible, and the camera main body 10 is unable to acquire information (such as F number) of the interchangeable lens. However, the camera main body 10 according to the present invention is able to acquire a current F number of the interchangeable lens even if the incompatible interchangeable lens is mounted on the mount as described later.

FIG. 11 is a sectional view of principal sections of the image sensor applied to the camera main body 10 according to another embodiment. In addition, the image sensor 140 shown in FIG. 11 is different from the image sensor 14 shown in FIG. 4 mainly in terms of the number of divided lower electrodes (separated electrodes). However, those are the same in the other points, and thus a detailed description thereof will be omitted.

The separated electrodes 142 of the image sensor 140 shown in FIG. 11 are formed to correspond to the respective divided regions which are obtained by dividing one pixel into 12×12, 144 divided regions. FIG. 11 shows divided regions $P_1$ to $P_{12}$ corresponding to the 12 separated electrodes in the horizontal direction. Further, in a case where light is incident into all the divided regions $P_1$ to $P_{12}$ (in a case where signals are detected from all the divided regions $P_1$ to $P_{12}$), the F number is set to F1.4. Furthermore, FIG. 11 shows the case where signals are detected from all the divided regions $P_1$ to $P_{12}$. Accordingly, shading of the interchangeable lens decreases signal values of the peripheral portion relative to those of the center of the pixel.

At this time, in a case where the incompatible interchangeable lens is mounted on the camera main body 10 and the F number is switched by operating a diaphragm ring of the interchangeable lens while viewing the eyepiece section 10-6 of the optical finder or the liquid crystal monitor 30 (FIG. 2), normally, it is not possible to check the F number.

However, the range of the incident angle of the light incident into the pixel can be detected on the basis of the signals of the divided regions $P_1$ to $P_{12}$. Accordingly, the camera main body 10 is able to detect the F number. Further, the detected F number can be displayed on the LCD (not shown in the drawing) provided in the eyepiece section 10-6 of the optical finder or the liquid crystal monitor 30.

Figure 12:
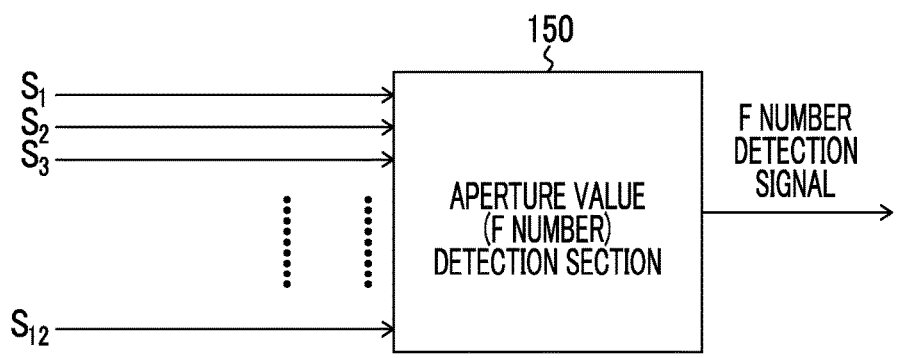
FIG. 12 is a block diagram illustrating an aperture value detection section of the imaging device.

FIG. 12 is a block diagram illustrating an aperture value detection section of the imaging device 1.

The aperture value detection section 150 can be provided in, for example, the digital signal processing section 24.

The signals $S_1$ to $S_{12}$ corresponding to the divided regions $P_1$ to $P_{12}$ shown in FIG. 11 are given to the aperture value detection section 150. Thus, the aperture value detection section 150 detects a current F number of the interchangeable lens, on the basis of the signals $S_1$ to $S_{12}$.

That is, in the case where signals indicating incident light can be acquired from all the divided regions $P_1$ to $P_{12}$ as shown in FIG. 11, the aperture value detection section 150 determines that the F number is F1.4. Likewise, in a case where the signals indicating the incident light can be acquired from only the divided regions $P_3$ to $P_{10}$, it is determined that the F number is F2. In addition, in a case where the signals indicating the incident light can be acquired from only the divided regions $P_4$ to $P_9$, it is determined that the F number is F2.8.

In contrast, in a case where the signals indicating the incident light can be acquired from only the divided regions $P_5$ to $P_8$, the F number is F4 or F5.6. In this case, by comparing values of the signals of the central divided regions $P_6$ and $P_7$ with values of the signals of the divided regions $P_5$ and $P_8$, in a case where the differences therebetween are within the threshold value, it is determined that the F number is F4, and in a case where the differences are greater than the threshold value, it is determined that the F number is F5.6.

Further, in a case where the signals indicating the incident light can be acquired from only the divided regions $P_6$ and $P_7$, it is determined that the F number is F8 or less (that is, F8, F11, or F22). Normally, the diaphragm ring is operated to be stopped down or to be opened up sequentially by one stop at a time. However, whenever the diaphragm is stopped down by one stop, an aperture area of the diaphragm is decreased to a half thereof. Accordingly, in a case where the sum of the signals of the divided regions $P_6$ and $P_7$ is equal to a half of the sum of the signals of the divided regions $P_5$ to $P_8$ at F5.6, it is determined that the F number is F8. Likewise, in a case where the sum of the signals of the divided regions $P_6$ and $P_7$ is equal to a half thereof when it is determined that the F number is F8, it can be determined that the F number is F11. In addition, in a case where the sum is equal to a quarter thereof, it can be determined that the F number is F22.

That is, the aperture value detection section 150 is able to detect which range the signals can be acquired from, in the signals $S_1$ to $S_{12}$ corresponding to the divided regions $P_1$ to $P_{12}$, and detect the F number on the basis of magnitudes of the signals at that time.

The aperture value detection section 150 outputs the F number detection signal to the CPU 40 (FIG. 3). If the F number detection signal is input from the aperture value detection section 150, the CPU 40 causes the LCD provided in the eyepiece section 10-6 of the optical finder or the liquid crystal monitor 30 to perform display thereof.

Thereby, in the case where the incompatible interchangeable lens is mounted, a user is able to check the F number even in a case of operating the diaphragm ring of the incompatible interchangeable lens while viewing the eyepiece section 10-6 of the optical finder.

Further, the CPU 40 (auto-exposure control section) is able to perform control (aperture-priority auto-exposure control) of a shutter speed for performing imaging using appropriate exposure on the basis of the luminance of the subject, which is detected by the AE detection section 44, and the current F number of the incompatible interchangeable lens which is detected by the aperture value detection section 150.

In addition, in the description of FIGS. 11 and 12, the signals are acquired from the 12 divided regions $P_1$ to $P_{12}$ in the horizontal direction, among the 12×12, 144 divided regions. However, the signals may be acquired from all the divided regions. Further, it is preferable that, as the pixel in the case of determining the F number, a pixel at the central portion of the image sensor 140 is selected. Further, the number of divided parts of a single pixel and a division method therefor are not limited to the embodiment shown in FIG. 4 or 11, and various aspects may be considered. The division method is not limited to division using equivalent intervals. The division may be performed with intervals corresponding to the F number, and the lower electrodes (separated electrodes) may be divided in a concentric shape.

Examples of other embodiments of the imaging device 1 include a mobile phone having a camera function, a smartphone, a personal digital assistant (PDA), and a portable game machine. Hereinafter, a detailed description will be given of an example of a smartphone with reference to the accompanying drawings.

<Configuration of Smartphone>

Figure 13:
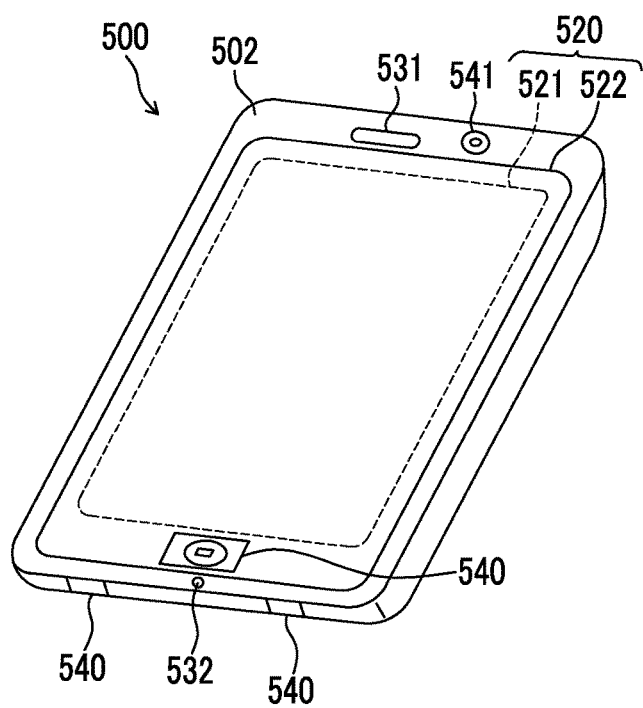
FIG. 13 is a perspective view illustrating an appearance of a smartphone.

FIG. 13 shows an appearance of a smartphone 500 which is another embodiment of the imaging device 1. The smartphone 500 shown in FIG. 13 includes: a housing 502 that has a flat plate shape; a display panel 521 as a display section on one side of the housing 502; and a display input section 520 into which an operation panel 522 as an input section is integrated. Further, the housing 502 includes a speaker 531, a microphone 532, operation sections 540, and a camera section 541. It should be noted that the configuration of the housing 502 is not limited to this. For example, it may be possible to adopt a configuration in which the input section and the display section are independently provided, or it may be possible to adopt a configuration having a slide mechanism or a folded structure.

Figure 14:
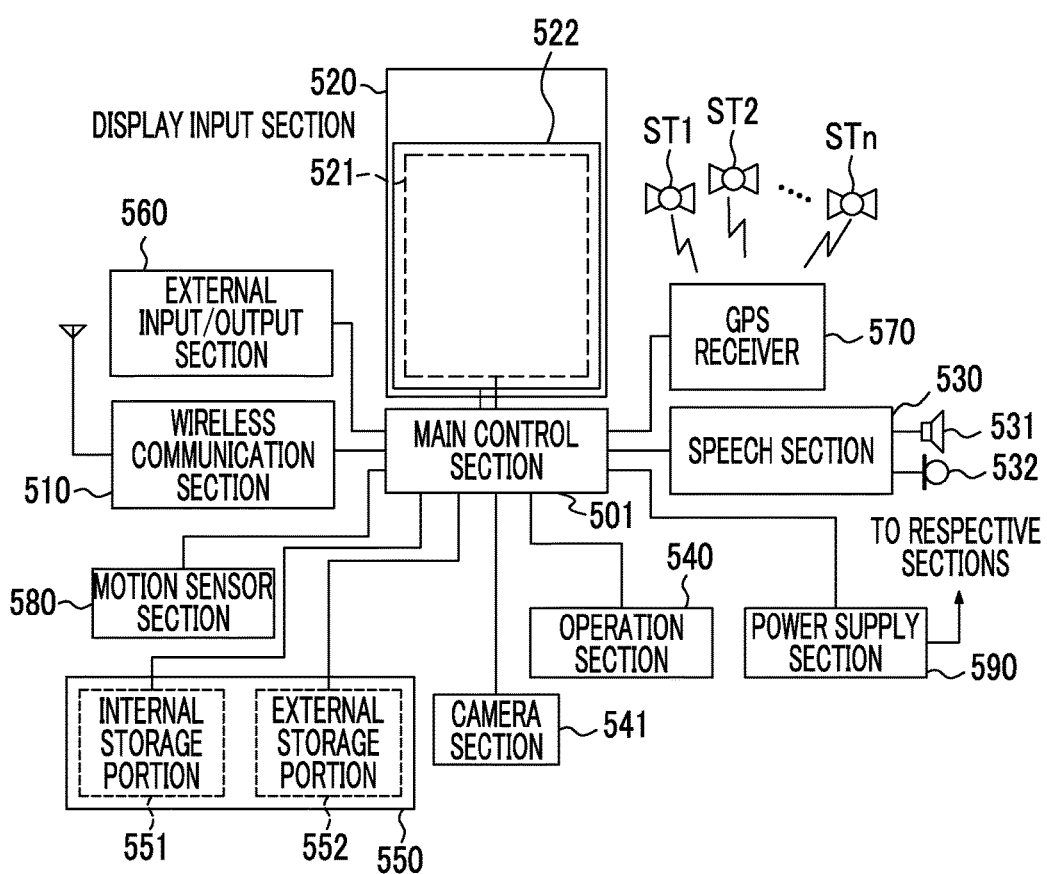
FIG. 14 is a block diagram illustrating a configuration of the smartphone.

FIG. 14 is a block diagram illustrating a configuration of the smartphone 500 shown in FIG. 13. As shown in FIG. 14, the smartphone 500 includes, as main components, a wireless communication section 510, a display input section 520, a speech section 530, the operation sections 540, the camera section 541, a storage section 550, an external input/output section 560, a global positioning system (GPS) receiver 570, a motion sensor section 580, a power supply section 590, and a main control section 501. As the main function of the smartphone 500, there is provided a wireless communication function for performing mobile wireless communication with a base station device BS through a mobile communication network NW.

The wireless communication section 510 performs wireless communication with the base station device BS, which is included in the mobile communication network NW, in accordance with an instruction of the main control section 501. Using this wireless communication, various kinds of file data such as audio data and image data, e-mail data, and the like are transmitted and received, and web data, streaming data, and the like are received.

The display input section 520 is a so-called touch panel, and includes the display panel 521 and the operation panel 522. The touch panel displays image (still image and moving image) information, text information, or the like so as to visually transfer the information to a user in accordance with control of the main control section 501, and detects a user operation on the displayed information. In a case of monitoring a generated 3D image, it is preferable that the display panel 521 is a 3D display panel.

The display panel 521 uses a liquid crystal display (LCD), an organic electro-luminescence display (OELD), or the like as a display device.

The operation panel 522 is a device that is provided for viewing an image which is displayed on a display screen of the display panel 521 and that detects a single pair of coordinates or a plurality of pairs of coordinates at which an operation is performed by a user's finger or a stylus. When such a device is operated by a user's finger or a stylus, the device outputs a detection signal, which is generated due to the operation, to the main control section 501. Subsequently, the main control section 501 detects an operation position (coordinates) on the display panel 521, on the basis of the received detection signal.

As shown in FIG. 13, the display panel 521 and the operation panel 522 of the smartphone 500 are integrated to constitute the display input section 520. However, the operation panel 522 is disposed to completely cover the display panel 521. When this arrangement is adopted, the operation panel 522 may have a function of also detecting a user operation in a region outside the display panel 521. In other words, the operation panel 522 may include a detection region (hereinafter referred to as a display region) for a part which overlaps with the display panel 521 and a detection region (hereinafter referred to as a non-display region) for the other part at the outer edge which does not overlap with the display panel 521.

A size of the display region and a size of the display panel 521 may completely coincide with each other, but it is not always necessary for both to coincide with each other. Further, the operation panel 522 may include two sensing regions of the outer edge part and the other inside part. Furthermore, a width of the outer edge part is appropriately designed depending on a size of the housing 502 and the like. In addition, examples of the position detection method adopted by the operation panel 522 may include a matrix switch method, a resistance film method, a surface elastic wave method, an infrared method, an electromagnetic induction method, and an electrostatic capacitance method, and the like, and any method may be adopted.

The speech section 530 includes a speaker 531 and a microphone 532. The speech section 530 is able to convert a sound of a user, which is input through the microphone 532, into sound data, which can be processed in the main control section 501, and output the data to the main control section 501, and decodes sound data, which is received by the wireless communication section 510 or the external input/output section 560, and outputs the data from the speaker 531. Further, as shown in FIG. 13, for example, the speaker 531 and the microphone 532 can be mounted on the same surface as the surface on which the display input section 520 is provided.

The operation section 540 is a hardware key using a key switch or the like, and receives an instruction from a user. For example, the operation sections 540 are pressing button type switches which are mounted on the lower side surface of the lower part of the housing 502 of the smartphone 500. Each switch is turned on if it is pressed by a finger or the like, and is turned off due to restoring force of a spring if the finger is released.

The storage section 550 stores a control program and control data of the main control section 501, the first filter according to the present invention, address data in which names, phone numbers, and the like of communication partners are associated, received and transmitted e-mail data, web data which is downloaded by web browsing, and downloaded contents data, and temporarily stores streaming data and the like. Further, the storage section 550 is constituted of an internal storage portion 551, which is built into the smartphone, and an external storage portion 552 which has a removable external memory slot. In addition, each of the internal storage portion 551 and the external storage portion 552 constituting the storage section 550 is implemented by using a storage medium such as a flash memory type, a hard disk type, a multimedia card micro type, a card type memory (such as a Micro SD (registered trademark) memory), a random access memory (RAM), or a read only memory (ROM).

The external input/output section 560 has a function of an interface with all external devices connected to the smartphone 500. The external input/output section 160 is for communication (such as universal serial bus (USB) or IEEE1394) with other external devices, direct or indirect connection to networks (such as the Internet, wireless LAN, Bluetooth (registered trademark), radio frequency identification (RFID), infrared communication (Infrared Data Association: IrDA) (registered trademark), ultra wideband (UWB) (registered trademark), and ZigBee (registered trademark)), or the like.

Examples of the external devices connected to the smartphone 500 include a wired/wireless headset, a wired/wireless external charger, a wired/wireless data port, a memory card which is connected through a card socket, a subscriber identity module (SIM) or user identity module (UIM) card, external audio and video devices which are connected through audio and video input/output (I/O) terminals, external audio and video devices which are connected in a wireless manner, a smartphone which is connected in a wired or wireless manner, a personal computer which is connected in a wired or wireless manner, a PDA which is connected in a wired or wireless manner, earphones, and the like. The external input/output section is able to transfer the data, which is transmitted from such external devices, to the components within the smartphone 500, and to transmit the data within the smartphone 500 to the external devices.

The GPS receiver 570 receives a plurality of GPS signals, which are transmitted from GPS satellites ST1 to STn, in accordance with instructions of the main control section 501, executes positioning calculation processing based on the received GPS signals, and detects a position formed of a latitude, a longitude, and an altitude of the smartphone 500. The GPS receiver 570 may detect the position by using position information when it is possible to acquire the position information from the wireless communication section 510 or the external input/output section 560 (for example, wireless LAN).

The motion sensor section 580 includes, for example, a triaxial acceleration sensor, and detects physical movement of the smartphone 500, in accordance with an instruction of the main control section 501. By detecting physical movement of the smartphone 500, an acceleration and a direction of the movement of the smartphone 500 are detected. This detection result is output to the main control section 501.

The power supply section 590 supplies the respective sections of the smartphone 500 with electric power, which is stored in a battery (not shown), in accordance with an instruction of the main control section 501.

The main control section 501 includes a micro processor, and integrally controls the respective sections of the smartphone 500 by performing an operation on the basis of control data or a control program stored in the storage section 550. Further, the main control section 501 has an application processing function and a mobile communication control function of controlling the respective sections of a communication system in order to perform data communication and sound communication through the wireless communication section 510.

The application processing function is implemented by an operation of the main control section 501 using application software stored in the storage section 550. Examples of the application processing function include: an infrared communication function of performing data communication with other devices by controlling the external input/output section 560; an e-mail function of transmitting and receiving e-mails; a web browsing function of browsing web pages; and the like.

The main control section 501 has an image processing function of displaying a video on the display input section 520 and the like, on the basis of image data (still image and moving image data) such as received data and downloaded streaming data. The image processing function means a function of causing the main control section 501 to decode the image data, apply image processing to the corresponding decoding result, and display an image on the display input section 520.

The main control section 501 executes display control for the display panel 521 and operation detection control to detect the user operation through the operation sections 540 and the operation panel 522.

Through execution of the display control, the main control section 501 displays an icon for activating application software and a window for displaying a software key such as a scroll bar or creating an e-mail. In addition, the scroll bar means a software key for receiving an instruction to move a display portion of an image on a large image which cannot be entirely shown in the display region of the display panel 521.

Through execution of the operation detection control, the main control section 501 detects the user operation performed through the operation section 540, receives an operation performed on the icon or a text input performed in an input field of the window through the operation panel 522, or receives a request to scroll a displayed image through the scroll bar.

The main control section 501 has a touch panel control function performed through execution of the operation detection control. The function determines whether the operation position of the operation panel 522 is in the overlapping part (display region) which overlaps with the display panel 521 or the other part (non-display region) at the outer edge which does not overlap with the display panel 521, and controls the display position of the software key or the sensing region of the operation panel 522.

The main control section 501 may detect a gesture operation performed on the operation panel 522, and may execute a preset function in response to the detected gesture operation. The gesture operation is not a simple touch operation used in the past. The gesture operation means an operation for drawing a locus with a finger or the like, an operation of specifying a plurality of positions at the same time, or an operation of drawing loci from a plurality of positions to at least one position as a combination of the above-mentioned operations.

The camera section 541 is a digital camera for performing electronic imaging by using the above-mentioned image sensor 14 or the like. The imaging device 1 can be applied to the camera section 541.

Under the control of the main control section 501, the camera section 541 is able to convert the image data, which is obtained through image capturing, into compressed image data such as data of a joint photographic coding experts group (JPEG), and to record the data in the storage section 550 and to output the data through the external input/output section 560 or the wireless communication section 510. In the smartphone 500 shown in FIG. 13, the camera section 541 is mounted on the same side as the display input section 520. However, the mounting position of the camera section 541 is not limited to this. The camera section 541 may be mounted on the rear side of the display input section 520, or a plurality of camera sections 541 may be mounted. In addition, in the case where a plurality of camera sections 541 is mounted, imaging may be performed using a single camera section 541 by switching the camera section 541 for the imaging, or imaging may be performed using the plurality of camera sections 541 at the same time.

The camera section 541 can be used in various functions of the smartphone 500. For example, an image, which is acquired by the camera section 541, can be displayed on the display panel 521, and an image of the camera section 541 as one of the operation inputs of the operation panel 522 can be used. Further, when the GPS receiver 570 detects a position, the GPS receiver 570 may detect the position with reference to the image acquired from the camera section 541. Furthermore, it may be possible to determine a direction of optical axis of the camera section 541 of the smartphone 500 or determine a current user environment, using the GPS receiver 570 in a combination with the triaxial acceleration sensor or without using the triaxial acceleration sensor, with reference to the image acquired from the camera section 541. Needless to say, the image acquired from the camera section 541 may be used in the application software.

In addition, in the embodiment shown in FIG. 1, the imaging device using the interchangeable lens was described, but the present invention can be applied to a lens-integrated imaging device.

Further, it is apparent that the present invention is not limited to the above-mentioned embodiments, and may be modified into various forms without departing from the scope of the present invention.

EXPLANATION OF REFERENCES

1: imaging device
10: camera main body
12: optical imaging system (interchangeable lens)
12A: diaphragm
14, 140: image sensor
14-3: separated electrode (lower electrode)
14-4: organic layer
14-5: upper electrode
15: microlens
16: reading section
24: digital signal processing section
30: liquid crystal monitor
32: sensor control section
34: lens control section
38: operation section
40: CPU
44: AE detection section
110, 112: ghost light
120: ghost light elimination section
122: pixel signal generation section
124: ghost detection section
150: aperture value detection section

What is claimed is:

1. An imaging device comprising:
   an image sensor that is configured such that a plurality of pixels having an organic layer for photoelectric conversion is two-dimensionally arranged, and each pixel of the image sensor is divided into a plurality of regions, and has an on-chip microlens, which forms a pupil image of a optical imaging system on the plurality of regions, and reading sections which respectively read photoelectrically converted signals of the plurality of divided regions;
   an optical diaphragm that mechanically stops down rays which are incident into the image sensor; and
   an electronic diaphragm section that electronically controls an aperture value, and that selects signals of the divided regions corresponding to the aperture value from the signals of the plurality of divided regions, on the basis of the aperture value which is controlled by the optical diaphragm.

2. The imaging device according to claim 1, further comprising a pixel signal generation section that adds the signals of the divided regions selected by the electronic diaphragm, and generates a pixel signal for each pixel.

3. The imaging device according to claim 1, further comprising a storage section that stores a relationship between the aperture value and the divided regions to be selected by the electronic diaphragm,
   wherein the electronic diaphragm acquires the corresponding divided regions from the storage section on the basis of the aperture value which is controlled by the optical diaphragm, and selects signals of the acquired divided regions.

4. The imaging device according to claim 1, further comprising:
   a signal strength detection section that detects at least a signal strength of a signal of a peripheral portion among a signal of a central portion and the signal of the peripheral portion in the plurality of divided regions of each pixel which are read by the reading section; and
   a ghost detection section that detects a ghost image on the basis of the signal strength which is detected by the signal strength detection section.

5. The imaging device according to claim 4, wherein if the signal strength of the signal of the peripheral portion is greater than a threshold value on the basis of the signal strength detected by the signal strength detection section, or if a ratio between the signal strength of the signal of the peripheral portion and the signal strength of the signal of the central portion is outside a range of the threshold value, the ghost detection section determines that ghost light is incident into the pixel.

6. The imaging device according to claim 5, further comprising a pixel signal generation section that adds the signals of the divided regions selected by the electronic diaphragm, and generates a pixel signal for each pixel,
  wherein the pixel signal generation section generates the pixel signal of the pixel into which the ghost light is incident, on the basis of the signals of the divided regions, into which the ghost light is not incident, among the plurality of divided regions of the pixel.

7. The imaging device according to claim 1, wherein the optical imaging system is an interchangeable lens including the optical diaphragm.

8. The imaging device according to claim 7, further comprising an aperture value detection section that detects a current aperture value of the interchangeable lens, on the basis of the signals of the plurality of divided regions, in a case where information about the aperture value cannot be acquired from the interchangeable lens.

9. The imaging device according to claim 8, wherein the aperture value detection section detects the current aperture value of the interchangeable lens, on the basis of the signals of the plurality of divided regions of the pixel in the central portion of the image sensor.

10. The imaging device according to claim 8, further comprising a display section that displays the aperture value detected by the aperture value detection section.

11. The imaging device according to claim 8, further comprising:
  a luminance detection section that detects a luminance of a subject; and
  an auto-exposure control section that controls exposure on the basis of the luminance of the subject which is detected by the luminance detection section,
  wherein the auto-exposure control section controls a shutter speed on the basis of the luminance of the subject, which is detected by the luminance detection section, and the aperture value which is detected by the aperture value detection section.

12. An imaging device comprising:
  an image sensor that is configured such that a plurality of pixels having an organic layer for photoelectric conversion is two-dimensionally arranged, and each pixel of the image sensor is divided into a plurality of regions, and has an on-chip microlens, which forms a pupil image of an interchangeable lens including an optical diaphragm on the plurality of regions, and reading sections which respectively read photoelectrically converted signals of the plurality of divided regions; and
  an aperture value detection section that detects a current aperture value of the interchangeable lens, on the basis of the signals of the plurality of divided regions, which are read by the reading sections, in a case where information about the aperture value cannot be acquired from the interchangeable lens.

13. An imaging method for an imaging device including an image sensor that is configured such that a plurality of pixels having an organic layer for photoelectric conversion is two-dimensionally arranged, and each pixel of the image sensor is divided into a plurality of regions, and has an on-chip microlens, which forms a pupil image of a optical imaging system on the plurality of regions, and reading sections which respectively read photoelectrically converted signals of the plurality of divided regions, and an optical diaphragm that mechanically stops down rays which are incident into the image sensor, the imaging method comprising:
  a step of acquiring an aperture value which is controlled by the optical diaphragm;
  a step of selecting signals of the divided regions corresponding to the aperture value from the signals of the plurality of divided regions on the basis of the acquired aperture value; and
  a step of adding the selected signals of the divided regions for each pixel of the image sensor and generating a pixel signal for each pixel.

14. The imaging method according to claim 13, further comprising:
  a step of detecting at least a signal strength of a signal of a peripheral portion among a signal of a central portion and the signal of the peripheral portion in the plurality of divided regions; and
  a step of detecting a ghost image on the basis of the detected signal strength.

15. The imaging method according to claim 13,
  wherein the optical imaging system is an interchangeable lens including the optical diaphragm, and
  wherein the imaging method further comprises:
  a step of reading the signals of the plurality of divided regions in a case where information about the aperture value is not acquired from the interchangeable lens; and
  a step of detecting a current aperture value of the interchangeable lens, on the basis the read signals of the plurality of divided regions.

* * * * *